United States Patent
Kim et al.

(10) Patent No.: US 10,431,462 B2
(45) Date of Patent: Oct. 1, 2019

(54) PLASMA ASSISTED DOPING ON GERMANIUM

(71) Applicant: Lam Research Corporation, Fremont, CA (US)

(72) Inventors: Yunsang Kim, Monte Sereno, CA (US); Hyuk-Jun Kwon, Daegu (KR)

(73) Assignee: Lam Research Corporation, Fremont, CA (US)

( * ) Notice: Subject to any disclaimer, the term of this patent is extended or adjusted under 35 U.S.C. 154(b) by 24 days.

(21) Appl. No.: 15/889,828

(22) Filed: Feb. 6, 2018

(65) Prior Publication Data

US 2018/0233365 A1 Aug. 16, 2018

Related U.S. Application Data

(60) Provisional application No. 62/459,358, filed on Feb. 15, 2017.

(51) Int. Cl.
*H01L 21/223* (2006.01)
*H01L 29/167* (2006.01)
(Continued)

(52) U.S. Cl.
CPC .......... *H01L 21/2236* (2013.01); *H01J 37/00* (2013.01); *H01L 21/324* (2013.01); *H01L 21/67017* (2013.01); *H01L 21/67109* (2013.01); *H01L 21/67115* (2013.01); *H01L 29/167* (2013.01); *H01L 21/0217* (2013.01); *H01L 21/0228* (2013.01)

(58) Field of Classification Search
CPC . H01L 21/2236; H01L 21/324; H01L 29/167; H01L 21/0217; H01L 21/0228; H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; C23C 14/48
See application file for complete search history.

(56) References Cited

U.S. PATENT DOCUMENTS

2007/0212861 A1* 9/2007 Chidambarrao .. H01L 21/26506
438/530
2014/0004689 A1* 1/2014 Nainani ............ H01L 29/66803
438/559

OTHER PUBLICATIONS

Kim et al., "Improved germanium n+/p junction diodes formed by coimplantation of antimony and phosphorus", Feb. 2011, Appl. Phys. Lett. 98, 082112, 3 pages (Year: 2011).*

(Continued)

*Primary Examiner* — Scott B Geyer

(57) ABSTRACT

A method for forming a junction in a germanium (Ge) layer of a substrate includes arranging the substrate in a processing chamber. The method includes performing a plasma pretreatment on the substrate in the processing chamber for a predetermined pretreatment period using a pretreatment plasma gas mixture including hydrogen gas species. The method includes supplying a doping plasma gas mixture to the processing chamber including a phosphorous (P) gas species and an antimony (Sb) gas species. The method includes striking plasma in the processing chamber for a predetermined doping period. The method includes annealing the substrate during a predetermined annealing period to form the junction in the germanium (Ge) layer.

12 Claims, 3 Drawing Sheets

(51) Int. Cl.
*H01L 21/324* (2006.01)
*H01L 21/67* (2006.01)
*H01J 37/00* (2006.01)
*H01L 21/02* (2006.01)

(56) References Cited

OTHER PUBLICATIONS

Kim et al., "Multiple implantation and multiple annealing of phosphorus doped germanium to achieve n-type activation near the theoretical limit", Sep. 2012, Appl. Phys. Lett. 101, 112107, 3 pages (Year: 2012).*
Kim et al., "Activation of implanted n-type dopants in Ge over the active concentration of 1x10e20 cm-3 using coimplantation of Sb and P", Nov. 2009, Electrochemical and Solid-State Letters, 13 (1), pp. H12-H15. (Year: 2009).*
Brotzmann et al., "Intrinsic and extrinsic diffusion of phosphorus, arsenic, and antimony in germanium", Feb. 2008, J. Appl. Phys. 103, 033508, 7 pages. (Year: 2008).*
Thareja et al., "Electrical characteristics of germanium n+/p junctions obtained using rapid thermal annealing of coimplanted P and Sb", May 2011, IEEE Electron Device Letters, vol. 32, No. 5, pp. 608-610. (Year: 2011).*
Tahini et al., "Co-doping with antimony to control phosphorus diffusion in germanium", Feb. 2013, J. Appl. Phys. 113, 073704, 3 pages. (Year: 2013).*

* cited by examiner

PLASMA ASSISTED DOPING ON GERMANIUM

CROSS-REFERENCE TO RELATED APPLICATIONS

This application claims the benefit of U.S. Provisional Application No. 62/459,358, filed on Feb. 15, 2017. The entire disclosure of the application referenced above is incorporated herein by reference.

FIELD

The present disclosure relates to substrate processing systems, and more particularly systems and methods for plasma assisted doping of germanium.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During processing of substrates such as semiconductor wafers, ion implantation may be used to create a junction. During ion implantation, ions of a desired dopant species are accelerated into the substrate. For example, a substrate including an exposed layer of germanium (Ge) may be doped with phosphorous (P) species using an ion implantation process or $I^2P$. Antimony (Sb) species can also be co-doped with phosphorous (P) species using $I^2P$ to increase P levels in Ge. However, it is difficult to form an ultra-shallow junction (USJ) that is less than 10 nanometers (nm) in depth using $I^2P$ due to high energy used during an implantation process. Furthermore, the doping steps are typically followed by annealing at high temperatures, which causes further diffusion into the Ge. In other words, the implanted ions diffuse beyond the desired USJ depth.

SUMMARY

A method for forming a junction in a germanium (Ge) layer of a substrate includes arranging the substrate in a processing chamber; supplying a doping plasma gas mixture to the processing chamber including a phosphorous (P) gas species and an antimony (Sb) gas species; striking plasma in the processing chamber for a predetermined doping period; and annealing the substrate during a predetermined annealing period to form the junction in the germanium (Ge) layer.

In other features, the method includes performing a plasma pretreatment on the substrate in the processing chamber for a predetermined pretreatment period using a pretreatment plasma gas mixture including hydrogen gas species.

In other features, the hydrogen gas species includes molecular hydrogen ($H_2$) gas. The pretreatment plasma gas mixture includes another gas selected from a group consisting of argon (Ar) gas, helium (He) gas, and xenon (Xe) gas. The method includes controlling pressure in the processing chamber during at least one of the predetermined pretreatment period and the predetermined doping period in a range from 3 mTorr to 10 Torr.

In other features, the method includes supplying RF power in range from 50 to 3000 W and RF bias power is supplied in a range from 0 W to 200 W during at least one of the predetermined pretreatment period and the predetermined doping period. At least one of the predetermined pretreatment period and the predetermined doping period is in a range from 1 to 120 seconds.

In other features, the method includes controlling a processing temperature during at least one of the predetermined pretreatment period and the predetermined doping period in a range from 20° C. to 400° C. The antimony (Sb) gas species is selected from a group consisting of antimony chloride ($SbCl_5$) gas and stibine ($SbH_3$) gas. The phosphorous (P) gas species includes phosphine ($PH_3$) gas. The method includes controlling pressure in the processing chamber during the predetermined annealing period to a range from 100 mTorr to 10 Torr. The annealing includes flash annealing using at least one of a flash lamp and a laser.

A method for forming a junction in a germanium (Ge) layer of a substrate includes arranging the substrate in a processing chamber; forming the junction in the germanium (Ge) layer by plasma doping including one or more plasma treatments using a first plasma gas mixture including a phosphorous (P) gas species during a predetermined P doping period and one or more plasma treatments using a second plasma gas mixture including an antimony (Sb) gas species during a predetermined Sb doping period; and annealing the substrate during a predetermined annealing period to form the junction in the germanium (Ge) layer.

In other features, the method includes performing a plasma pretreatment on the substrate in the processing chamber for a predetermined pretreatment period using a pretreatment plasma gas mixture including hydrogen gas species.

In other features, the hydrogen gas species used during pretreatment includes molecular hydrogen ($H_2$). The pretreatment plasma gas mixture includes another gas selected from a group consisting of argon (Ar) gas, helium (He) gas, and xenon (Xe) gas. The method includes controlling pressure in the processing chamber during at least one of the predetermined pretreatment period, the predetermined P doping period and the predetermined Sb doping period to a range from 3 mTorr to 10 Torr.

In other features, the method includes supplying RF power during at least one of the predetermined pretreatment period, the predetermined P doping period and the predetermined Sb doping period in a range from 50 to 3000 W and RF bias power during at least one of pretreatment and doping in a range from 0 W to 200 W. At least one of the predetermined pretreatment period, the predetermined P doping period and the predetermined Sb doping period is in a range from 1 to 120 seconds.

In other features, the method includes controlling processing temperature during at least one of the predetermined pretreatment period, the predetermined P doping period and the predetermined Sb doping period to a range from 20° C. to 400° C. The antimony (Sb) gas species is selected from a group consisting of antimony chloride ($SbCl_5$) and stibine ($SbH_3$). The phosphorous (P) gas species used during the predetermined P doping period includes phosphine ($PH_3$). In other features, the method includes controlling pressure in the processing chamber during the predetermined annealing period to a range from 100 mTorr to 10 Torr. The annealing includes flash annealing and using at least one of a flash lamp and a laser.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
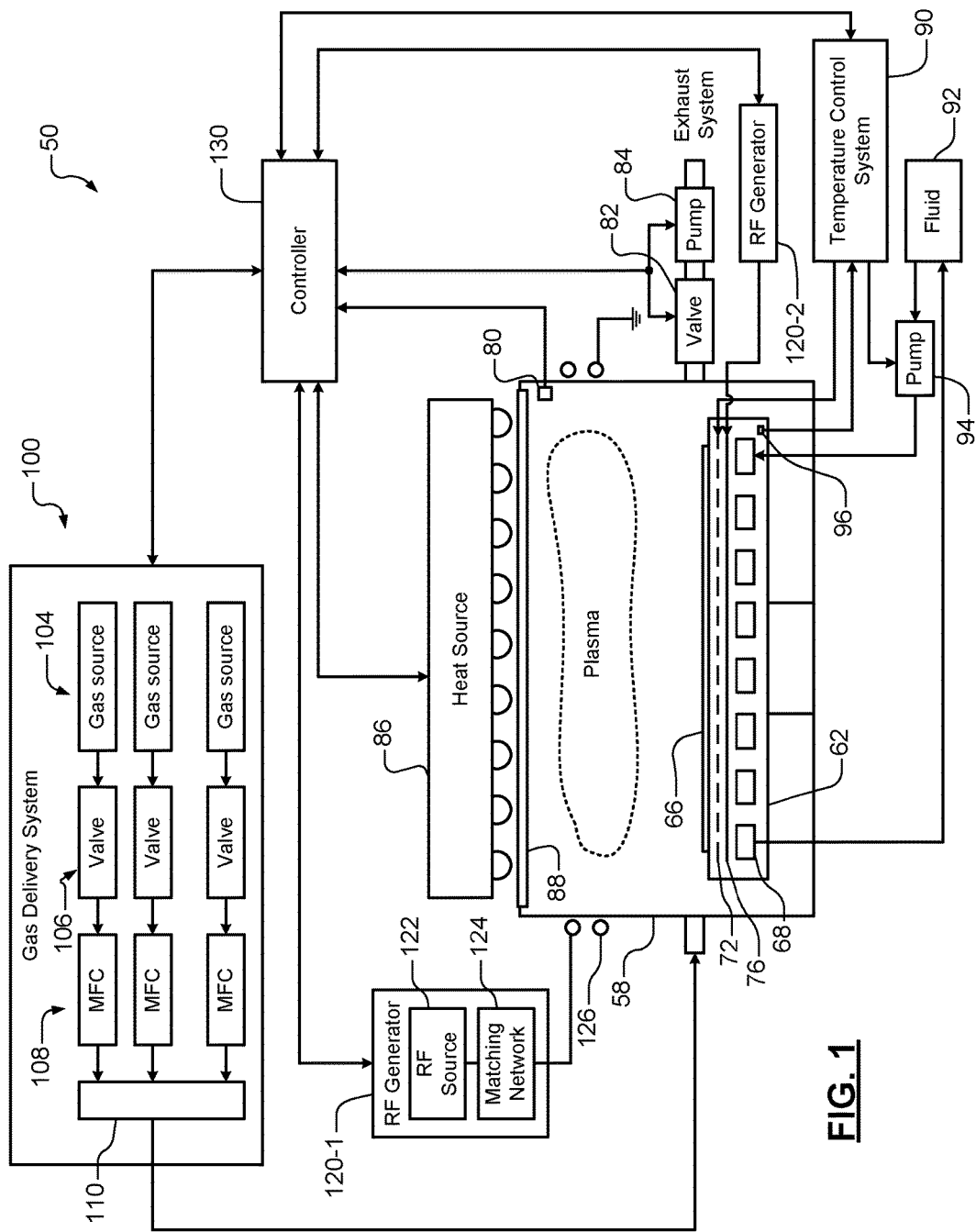
FIG. 1 is a functional block diagram of an example of a substrate processing system for co-doping of Ge according to the present disclosure.

Substrate processing systems may be used to dope film on a substrate such as a semiconductor wafer. The substrate processing systems include a processing chamber, a gas distribution device and a substrate support. During processing, the substrate is arranged on the substrate support. Different gas mixtures may be introduced into the processing chamber and radio frequency (RF) plasma may be used to produce ions that are used to dope an exposed layer of the substrate.

Systems and methods according to the present disclosure are used to create an ultra-shallow junction (USJ) in germanium (Ge) using plasma doping. In some examples, a pretreatment step is performed on the substrate prior to doping of the Ge layer with both P and Sb species. The pretreatment may include using plasma with a plasma gas mixture including a hydrogen gas species. When pretreatment is used, P dopant diffusion is suppressed in the junction due to either passivation of the Ge surface and/or blocking of a diffusion path of the dopants.

Co-doping is performed using a phosphorous (P) gas species and an antimony (Sb) gas species. The Sb dopants enhance the concentration of P species. More particularly, the substrate is exposed to plasma including a plasma gas mixture with a phosphorous (P) gas species and/or an antimony (Sb) gas species to create a junction in the germanium (Ge) layer. As can be appreciated, the doping concentrations of the P and Sb dopants can be varied by altering the relative P and Sb gas concentrations. The doping concentrations can be the same or different.

In some examples, the plasma gas mixture includes both the P and Sb gas species that are delivered to the processing chamber at the same time. In other examples, rather than co-doping using both P and Sb gas species at the same time, sequential doping is performed. For example, sequential doping may include a supercycle including a first plasma doping step using P gas species followed by a second plasma doping step using Sb species (or vice versa). The supercycle can be repeated one or more times. Alternately, other ordering variations of doping of P gas species and Sb gas species can be performed. The number of Sb and P doping steps need not be the same.

In some examples, an ultra-shallow junction (USJ) is formed at the Ge surface. In some examples, the USJ has a depth that is less than or equal to 10 nm. In some examples, the USJ has a depth that is less than or equal to 7 nm. In some examples, the USJ has a depth that is less than or equal to 5 nm.

In some examples, the P gas species includes phosphine ($PH_3$) and the antimony-gas species includes antimony pentachloride ($SbCl_5$) or stibine ($SbH_3$), although other P or Sb gas species can be used. In some examples, the plasma gas mixture includes inert or carrier gases such as helium (He). In some examples, a high density plasma (HDP) chemical vapor deposition (CVD) chamber is used, although other processes are contemplated.

In some examples, the substrate is arranged in the HDP CVD chamber. The substrate is initially pretreated using plasma including hydrogen species. Then, plasma doping of the substrate using P and Sb ions is performed (either at the same time or sequentially). A negative self-bias on the substrate attracts ions from the plasma and creates a thin layer or skin of P and/or Sb ions on a surface of the Ge layer. An ion energy decoupled condition of source power-only plasma does not degrade a 3D profile. Alternately, the substrate can be actively RF biased using a constant or pulsed RF source.

In some examples, the substrate is annealed after the USJ is doped using P and Sb co-dopants. For example, flash annealing can be used to diffuse the P and Sb dopants into the USJ in the Ge layer. While other types of annealing can be performed, flash annealing tends to limit heating and diffusion to the upper surface of the Ge layer as compared to other types of annealing. In some examples, while a temperature at a surface or skin of the substrate is locally increased during flash annealing to higher temperatures, the rest of the substrate is maintained at a temperature that is less than 400° C. during annealing.

Additional processing of the substrate may be performed after annealing. For example, a silicon nitride (SiN) layer or other layer may be deposited on the junction using a process such as atomic layer deposition (ALD).

Referring now to FIG. 1, an example of a substrate processing system 50 that can be used is shown. While the substrate processing system includes an inductively coupled plasma (ICP) source, other types of processing chambers and/or plasma sources (such as remote plasma sources) may be used. The substrate processing system 50 includes a processing chamber 58 and a substrate support 62 for supporting a substrate 66. In some examples, the substrate support 62 includes an electrostatic chuck or vacuum chuck. In some examples, the substrate support 62 is temperature controlled. For example, the substrate support 62 may include a plurality of fluid channels 68 and/or heaters 72, which may be arranged in one or more zones. The substrate support 62 may further include an electrode 76.

One or more sensors 80 such as temperature and/or pressure sensors may be arranged in the processing chamber 58 to sense temperature and/or pressure, respectively. A valve 82 and pump 84 may be used to control pressure within the processing chamber 58 and/or to evacuate reactants from the processing chamber 58.

A heat source 86 performs annealing such as rapid thermal processing (RTP) or flash annealing of the substrate 66 during a predetermined period following either doping and/or passivation. The heat source 86 may be arranged outside of the processing chamber 58 adjacent to a window 88 such as a dielectric window. In some examples, the heat source 86 includes a flash lamp, a laser and/or a microwave-source.

A temperature control system 90 may be used to control a temperature of the substrate support 62 and the substrate 66. The temperature control system 90 may control supply of a fluid from a fluid source 92 via a pump 94 that is connected to the fluid channels 68. The temperature control system 90 may also control operation of the heaters 72. The temperature control system 90 may include one or more temperature sensors 96 to sense temperatures of one or more locations or zones of the substrate support 62.

A gas delivery system 100 includes one or more gas sources 104, one or more valves 106, one or more mass flow controllers 108 and a mixing manifold 110. The gas delivery system 100 selectively supplies a plasma gas mixture, carrier and/or inert gases, and/or a purge gas mixture to the processing chamber 58 during pretreatment, doping, passivation, annealing and/or purging.

An RF generator 120-1 includes an RF source 122 and a matching network 124 that outputs RF power to a coil 126, which surrounds an outer wall of the processing chamber 58. The RF generator 120-1 creates a magnetic field in the processing chamber that strikes plasma. Another RF generator 120-2 may be used to supply an RF bias to the electrode 76 in the substrate support 62 during doping or self-bias (no RF bias) may be used. A controller 130 communicates with the one or more sensors 80, the valve 82 and pump 84, the temperature control system 90, the heat source 86, the RF generators 120-1 and/or 120-2, and the gas delivery system 100 to control the process.

A mixing ratio of the P-containing gas and the Sb-containing gas can be varied to adjust the relative dose of P and Sb ions delivered to the Ge surface. In another example, a dual plenum showerhead may be used to deliver the P-containing gas and the Sb-containing gas separately until they reach the processing chamber. The gases may be supplied at the same time or pulsed sequentially (a pulse of gas with P species followed by a pulse of gas with Sb species, etc). The plasma power can be pulsed in sync with the gas pulses. In some examples, different plasma power can be used for each gas to provide independent process control for the P doping and the Sb doping.

Figure 2:
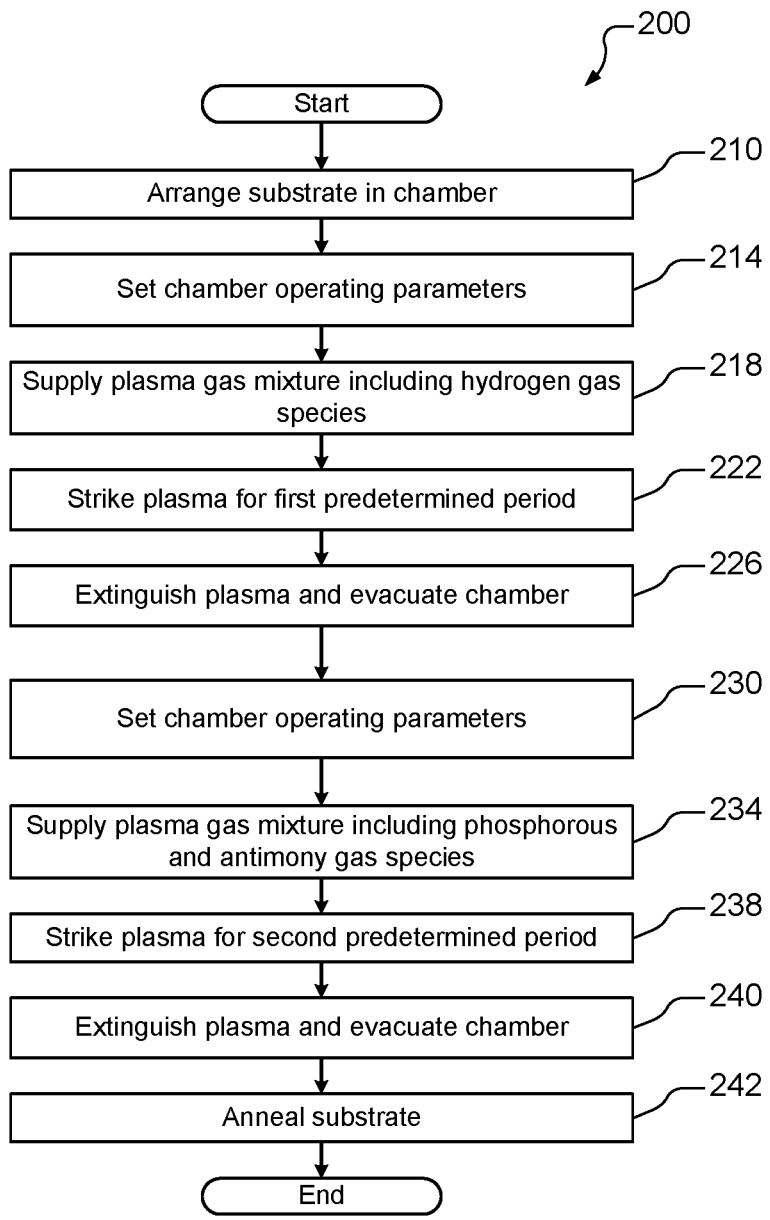
FIG. 2 is a flowchart of an example of a method for co-doping Ge to create an ultra-shallow junction according to the present disclosure.

Referring now to FIG. 2, a method 200 for co-doping of Ge to create a junction using P gas species and Sb gas species is shown. At 210, a substrate is arranged in a processing chamber. At 214, chamber operating parameters such as substrate support temperature, chamber pressure, RF power and bias power, and gas flows are set. At 218, a plasma gas mixture including hydrogen gas species is supplied to the processing chamber. At 222, plasma is struck in the processing chamber for a first predetermined period to pretreat the substrate. At 226, the plasma is extinguished after the first predetermined period and the chamber is purged or otherwise evacuated.

At 230, chamber operating parameters are set to other values for doping if needed. At 234, a plasma gas mixture including P and Sb gas species is supplied to the processing chamber. At 238, plasma is struck in the processing chamber for a second predetermined period. P and Sb dopants are deposited on and/or in the Ge layer. At 240, the plasma is extinguished after the second predetermined period and the processing chamber is purged or evacuated. At 242, the substrate is annealed. The annealing causes the dopants to diffuse into the junction.

Figure 3:
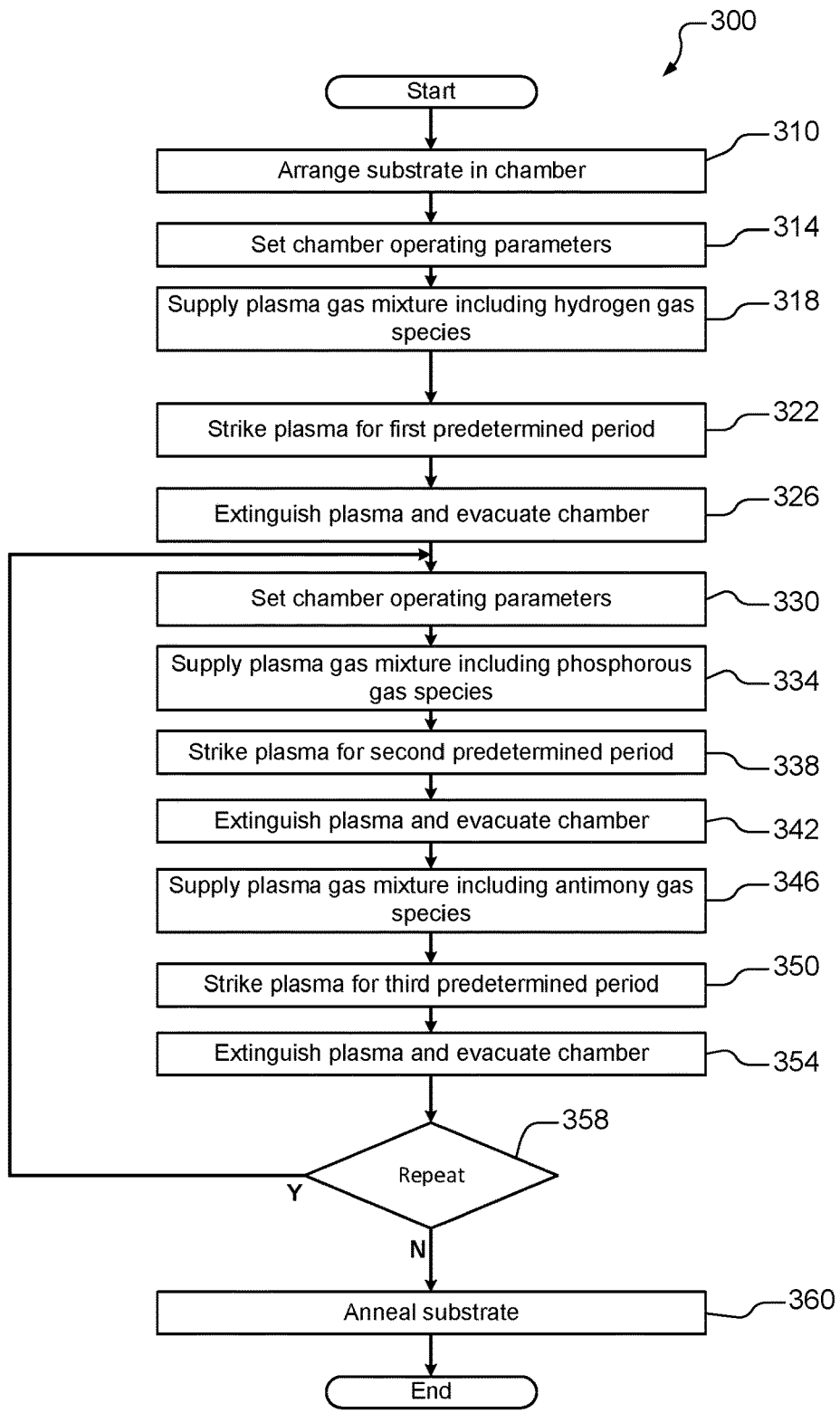
FIG. 3 is a flowchart of an example of another method for co-doping Ge to create an ultra-shallow junction according to the present disclosure.

Referring now to FIG. 3, a method 300 for doping of Ge using supercycles including one or more periods of exposure to plasma including P gas species and exposure to one or more periods of plasma including Sb gas species is shown. At 310, a substrate is arranged in a processing chamber. At 314, chamber operating parameters such as substrate support temperature, chamber pressure, RF power and bias power, and gas flows are set. At 318, a plasma gas mixture including hydrogen gas species is supplied to the processing chamber to pretreat the substrate. At 322, plasma is struck in the processing chamber for a first predetermined period. At 326, the plasma is extinguished after the first predetermined period and the chamber is purged or otherwise evacuated.

At 330, chamber operating parameters are set to other values if needed. At 334, a plasma gas mixture including P dopant species is supplied to the processing chamber. At 338, plasma is struck in the processing chamber for a second predetermined period. At 342, the plasma is extinguished after the second predetermined period and the chamber is purged or evacuated.

At 346, a plasma gas mixture including Sb dopant species is supplied to the processing chamber. At 350, plasma is struck in the processing chamber for a third predetermined period. At 354, the plasma is extinguished after the third predetermined period and the chamber is purged or evacuated. At 358, if additional doping is desired, the method returns to 330. Otherwise, the method continues at 360 and the substrate is annealed.

In some examples, the hydrogen gas species used during pretreatment includes molecular hydrogen ($H_2$) and may include argon (Ar), helium (He), xenon (Xe) and/or mixtures thereof. In some examples, the hydrogen gas species used during pretreatment includes a mixture of $H_2$ and Ar, a mixture of $H_2$ and He and/or a mixture of He and Xe. In some examples, a flowrate of the plasma gas mixture during pretreatment is in a range from 5 standard cubic centimeters (sccm) to 3000 sccm. In some examples, the chamber pressure during pretreatment is in a range from 3 mTorr to 10 Torr. In some examples, RF power supplied during pretreatment is in a range from 50 to 3000 W. In some examples, the RF power is supplied at a frequency in a range from 2 to 16 MHz, although other frequencies can be used. In some examples, the RF bias power is supplied in a range from 0 to 200 W. In some examples, the pretreatment is performed during a predetermined period in a range from 2 to 120 seconds. In some examples, processing temperature is maintained in a range from 20° C. to 400° C.

In some examples, the Sb gas species used during co-doping or Sb doping includes antimony pentachloride ($SbCl_5$) or stibine ($SbH_3$). In some examples, the P gas species used during co-doping or P doping includes phosphine ($PH_3$). In some examples, a flowrate of the dopant gas during doping is in a range from greater than 0 sccm to 200 sccm. In some examples, the chamber pressure during doping is in a range from 3 mTorr to 10 Torr. In some examples, RF power supplied during doping is in a range from 50 W to 3000 W. In some examples, the RF power is supplied at a frequency in a range from 2 to 16 MHz, although other frequencies can be used. In some examples, the RF bias power is in a range from 0 W to 200 W. In some examples, the doping is performed during a predetermined period in a range from 1 s to 120 s. In some examples, processing temperature is maintained in a range from 20° C. to 400° C.

In some examples, the gas species supplied during annealing includes molecular nitrogen ($N_2$), He, Ar and/or mixtures thereof. In some examples, a flowrate of the gas mixture during annealing is in a range from 5 sccm to 500 sccm. In some examples, the chamber pressure during annealing is in a range from 100 mTorr to 10 Torr. In some examples, flash annealing is performed using a flash lamp or a laser such as a psec laser. In some examples, the flash lamp provides 10 $J/cm^2$ to 40 $J/cm^2$. In some examples, the laser supplies 10 $mJ/cm^2$ to 20 $mJ/cm^2$. In some examples, the annealing is performed during a predetermined period in a range from 0.1 ms to 20 ms. In some examples, processing temperature is maintained in a range from 200° C. to 400° C.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for forming a junction in a germanium (Ge) layer of a substrate, comprising:
    arranging the substrate in a processing chamber;
    forming the junction in the germanium (Ge) layer by plasma doping including:
        one or more plasma treatments using a first plasma gas mixture including a phosphorus (P) gas species during a predetermined P doping period; and
        one or more plasma treatments using a second plasma gas mixture including an antimony (Sb) gas species during a predetermined Sb doping period; and
    annealing the substrate during a predetermined annealing period to form the junction in the germanium (Ge) layer.

2. The method of claim 1, further comprising performing a plasma pretreatment on the substrate in the processing chamber for a predetermined pretreatment period using a pretreatment plasma gas mixture including hydrogen gas species.

3. The method of claim 2, wherein the hydrogen gas species used during pretreatment includes molecular hydrogen ($H_2$).

4. The method of claim 2, wherein the pretreatment plasma gas mixture includes another gas selected from a group consisting of argon (Ar) gas, helium (He) gas, and xenon (Xe) gas.

5. The method of claim 2, further comprising controlling pressure in the processing chamber during at least one of the predetermined pretreatment period, the predetermined P doping period and the predetermined Sb doping period to a range from 3 mTorr to 10 Torr.

6. The method of claim 2, further comprising supplying RF power during at least one of the predetermined pretreatment period, the predetermined P doping period and the predetermined Sb doping period in a range from 50 to 3000 W and RF bias power during at least one of pretreatment and doping in a range from 0 W to 200 W.

7. The method of claim 2, wherein at least one of the predetermined pretreatment period, the predetermined P doping period and the predetermined Sb doping period is in a range from 1 to 120 seconds.

8. The method of claim 2, further comprising controlling processing temperature during at least one of the predetermined pretreatment period, the predetermined P doping period and the predetermined Sb doping period to a range from 20° C. to 400° C.

9. The method of claim 1, wherein the antimony (Sb) gas species is selected from a group consisting of antimony chloride ($SbCl_5$) and stibine ($SbH_3$).

10. The method of claim 1, wherein the phosphorus (P) gas species used during the predetermined P doping period includes phosphine ($PH_3$).

11. The method of claim 1, further comprising controlling pressure in the processing chamber during the predetermined annealing period to a range from 100 mTorr to 10 Torr.

12. The method of claim 1, wherein the annealing includes flash annealing and using at least one of a flash lamp and a laser.

* * * * *